United States Patent
West et al.

(10) Patent No.: US 10,679,935 B2
(45) Date of Patent: Jun. 9, 2020

(54) STRUCTURE AND METHOD FOR IMPROVING HIGH VOLTAGE BREAKDOWN RELIABILITY OF A MICROELECTRONIC DEVICE

(71) Applicant: TEXAS INSTRUMENTS INCORPORATED, Dallas, TX (US)

(72) Inventors: Jeffrey A. West, Dallas, TX (US); Byron Lovell Williams, Plano, TX (US); David Leonard Larkin, Richardson, TX (US); Weidong Tian, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/572,346

(22) Filed: Sep. 16, 2019

(65) Prior Publication Data

US 2020/0013713 A1    Jan. 9, 2020

Related U.S. Application Data

(63) Continuation of application No. 16/127,275, filed on Sep. 11, 2018, now Pat. No. 10,418,320, which is a
(Continued)

(51) Int. Cl.
*H01L 23/522* (2006.01)
*H01L 23/528* (2006.01)
(Continued)

(52) U.S. Cl.
CPC ...... *H01L 23/5222* (2013.01); *H01L 21/0217* (2013.01); *H01L 21/768* (2013.01); *H01L 23/5223* (2013.01); *H01L 23/5225* (2013.01); *H01L 23/5226* (2013.01); *H01L 23/5283* (2013.01); *H01L 23/53295* (2013.01);
(Continued)

(58) Field of Classification Search
CPC ............ H01L 23/5222; H01L 23/5225; H01L 23/5226; H01L 23/5283; H01L 24/06; H01L 28/40; H01L 23/62; H01L 2224/04042; H01L 23/5223; H01L 2224/05; H01L 23/53295;
(Continued)

(56) References Cited

U.S. PATENT DOCUMENTS 7,413,947 B2    8/2008  Larkin et al.
8,138,616 B2    3/2012  Chang et al.
(Continued)

FOREIGN PATENT DOCUMENTS

JP    2008210996 A1    9/2008

*Primary Examiner* — Jasmine J Clark
(74) *Attorney, Agent, or Firm* — Andrew R. Ralston; Charles A. Brill; Frank D. Cimino

(57) ABSTRACT

A method and structure suitable for, e.g., improving high voltage breakdown reliability of a microelectronic device such as a capacitor usable for galvanic isolation of two circuits. A first dielectric layer has a first dielectric constant located over a semiconductor substrate. A metal structure located over the first dielectric layer has a side surface. A second dielectric layer having a second different dielectric constant is located adjacent the metal structure. A dielectric structure located between the side surface of the metal structure and the second dielectric layer has the first dielectric constant.

18 Claims, 6 Drawing Sheets

Related U.S. Application Data continuation of application No. 15/478,615, filed on Apr. 4, 2017, now Pat. No. 10,109,574.

(51) Int. Cl.
    *H01L 23/532*     (2006.01)
    *H01L 49/02*     (2006.01)
    *H01L 21/768*     (2006.01)
    *H01L 23/00*     (2006.01)
    *H01L 21/02*     (2006.01)

(52) U.S. Cl.
    CPC .............. H01L 24/00 (2013.01); H01L 28/40 (2013.01); *H01L 2224/05* (2013.01); *H01L 2224/48463* (2013.01)

(58) Field of Classification Search
    CPC ....... H01L 2224/48463; H01L 21/0217; H01L 21/768; H01L 24/00
    See application file for complete search history.

(56) References Cited

U.S. PATENT DOCUMENTS

| | | | |
|---|---|---|---|
| 8,361,898 | B2 | 1/2013 | Wang et al. |
| 8,890,223 | B1 | 11/2014 | Bonifield et al. |
| 9,087,853 | B2 | 7/2015 | Tao et al. |
| 9,299,697 | B2 * | 3/2016 | West ........................ H01L 28/91 |
| 2006/0145251 | A1 | 7/2006 | Ko |
| 2013/0043970 | A1 | 2/2013 | Poddar et al. |
| 2013/0241058 | A1 | 9/2013 | Yu et al. |
| 2014/0266251 | A1 * | 9/2014 | Chevroulet .............. G01D 5/24 324/661 |
| 2016/0133690 | A1 | 5/2016 | West et al. |
| 2016/0163785 | A1 | 6/2016 | West et al. |
| 2019/0123134 | A1 | 4/2019 | Tao et al. |

* cited by examiner

STRUCTURE AND METHOD FOR IMPROVING HIGH VOLTAGE BREAKDOWN RELIABILITY OF A MICROELECTRONIC DEVICE

CROSS REFERENCE TO RELATED APPLICATIONS

Under 35 U.S.C. § 120, this continuation application claims the benefit of and priority to U.S. patent application Ser. No. 15/478,615, filed Apr. 4, 2017, issued as U.S. Pat. No. 10,109,574, the entirety of which is hereby incorporated herein by reference. This continuation application is a continuation of U.S. patent application Ser. No. 16/127,275, issued as U.S. Pat. No. 10,418,320, the entirety of which is hereby incorporated herein by reference.

FIELD OF THE DISCLOSURE

This disclosure relates generally to the field of semiconductor devices and the methods of fabrication thereof, and more particularly, without limitation, to a method and structure for improving high voltage breakdown reliability of microelectronic devices including, e.g., galvanic digital isolators.

BACKGROUND

Galvanic isolation is a principle of isolating functional sections of electrical systems to prevent current flow while energy or information can still be exchanged between the sections by other means, such as capacitance, induction or electromagnetic waves, or by optical, acoustic or mechanical means. Galvanic isolation is typically used where two or more electric circuits communicate but their grounds or reference nodes may be at different potentials. It is an effective method of breaking ground loops by preventing unwanted current from flowing between two units sharing a reference conductor. Galvanic isolation is also used for safety, preventing accidental current from reaching ground though a person's body.

Isolators are devices designed to minimize direct current (DC) and unwanted transient currents between two systems or circuits, while allowing data and power transmission between the two. In most applications, isolators also act as a barrier against high voltage in addition to allowing the system to function properly. Where capacitive elements are used as isolators, dielectric breakdown is a key concern, especially in high-voltage applications.

As the advances in the design of integrated circuits and semiconductor fabrication continue to take place, improvements in microelectronic devices, including galvanic isolators, are also being concomitantly pursued.

SUMMARY

The following presents a simplified summary in order to provide a basic understanding of one or more aspects of the present patent disclosure. This summary is not an extensive overview of the disclosure, and is neither intended to identify key or critical elements of the disclosure, nor to delineate the scope thereof. Rather, the primary purpose of the summary is to present some concepts of the disclosure in a simplified form as a prelude to a more detailed description that is presented later.

Embodiments of a method and structure are disclosed for improving high voltage breakdown reliability of a microelectronic device, e.g., a galvanic isolator, which involve removing or minimizing dielectric discontinuity by providing an abatement structure around one or more metal plate corners of a high voltage isolation capacitor in order to ameliorate the perturbative effects of an electric field at the corners during operation of the device.

In one aspect, embodiments of a microelectronic device include, inter alia, a semiconductor substrate having a top surface. A first dielectric layer located over the top surface has a first dielectric constant. A metal structure located over the first dielectric layer has a side surface. A second dielectric layer having a second different dielectric constant is located adjacent the metal structure. A dielectric structure located between the side surface of the metal structure and the second dielectric layer has the first dielectric constant. Further aspects provide methods of fabricating an electronic device consistent with the above-described embodiments.

BRIEF DESCRIPTION OF THE DRAWINGS

Embodiments of the present disclosure are illustrated by way of example, and not by way of limitation, in the Figures of the accompanying drawings in which like references indicate similar elements. It should be noted that different references to "an" or "one" embodiment in this disclosure are not necessarily to the same embodiment, and such references may mean at least one. Further, when a particular feature, structure, or characteristic is described in connection with an embodiment, it is submitted that it is within the knowledge of one skilled in the art to effect such feature, structure, or characteristic in connection with other embodiments whether or not explicitly described.

The accompanying drawings are incorporated into and form a part of the specification to illustrate one or more exemplary embodiments of the present disclosure. Various advantages and features of the disclosure will be understood from the following Detailed Description taken in connection with the appended claims and with reference to the attached drawing Figures in which:

DETAILED DESCRIPTION OF THE DRAWINGS

Figure 1A:
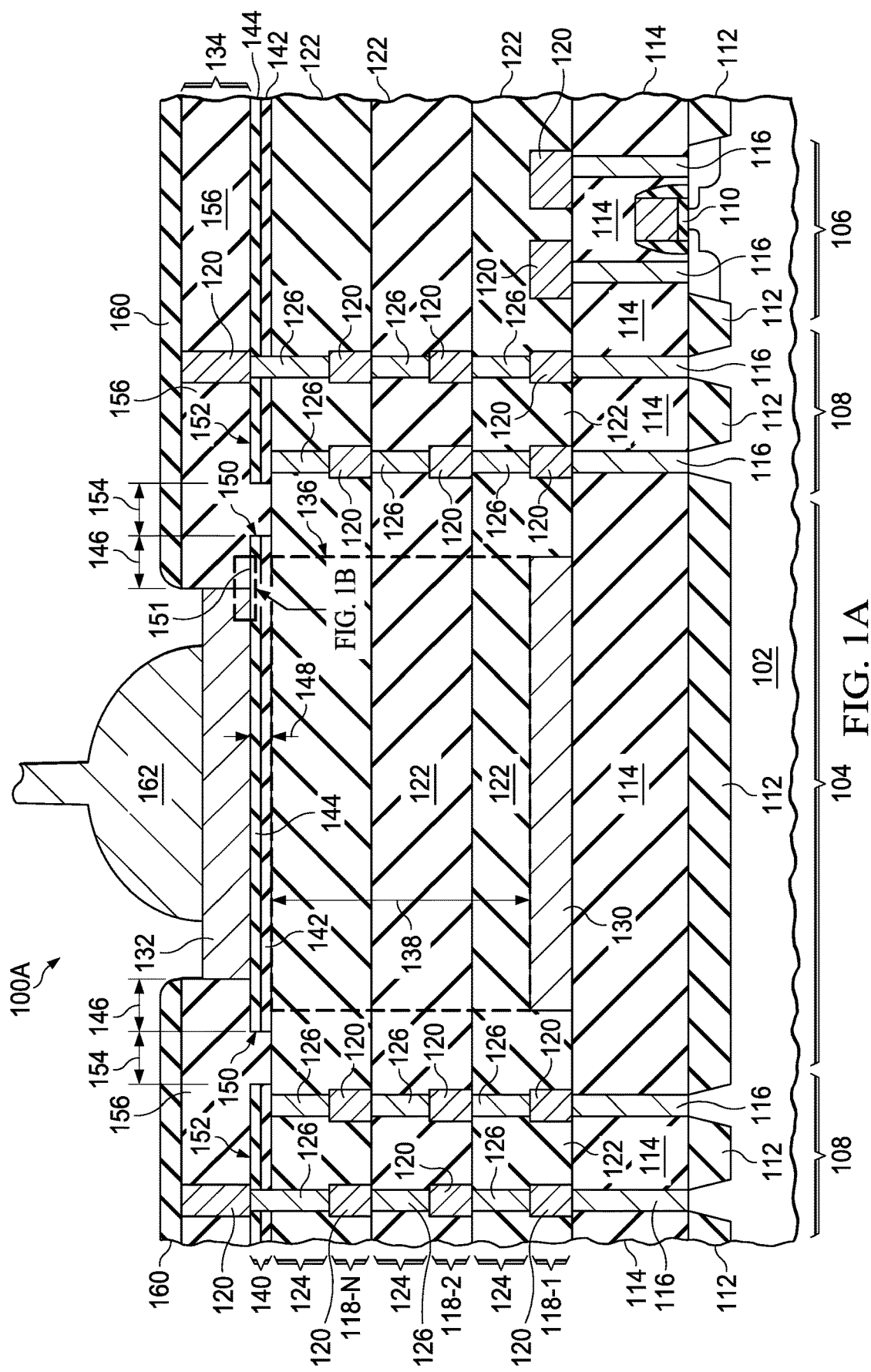
FIG. 1A depicts a cross-sectional view of a portion of an example microelectronic device having a galvanic isolation structure according to an aspect of the present disclosure.

The present disclosure is described with reference to the attached Figures wherein like reference numerals are generally utilized to refer to like elements throughout. The Figures are not drawn to scale and they are provided merely to illustrate the disclosure. Several aspects of the disclosure are described below with reference to example applications for illustration. It should be understood that numerous specific details, relationships, and methods are set forth to provide an understanding of the disclosure. In other instances, well-known structures or operations are not shown in detail to avoid obscuring the disclosure. The present disclosure is not limited by the illustrated ordering of acts or events, as some acts may occur in different orders and/or concurrently with other acts or events. Furthermore, not all illustrated acts or events are required to implement a methodology in accordance with the present disclosure.

In the following description, reference may be made to the accompanying drawings wherein certain directional terminology, such as, e.g., "upper", "lower", "top", "bottom", "left-hand", "right-hand", "front side", "backside", "vertical", "horizontal", etc., may be used with reference to the orientation of the Figures or illustrative elements thereof being described. Since components of embodiments can be positioned in a number of different orientations, the directional terminology is used for purposes of illustration and is in no way limiting. Likewise, references to features referred to as "first", "second", etc., are not indicative of any specific order, importance, and the like, and such references may be interchanged mutatis mutandis, depending on the context, implementation, etc. It is understood that further embodiments may be utilized and structural or logical changes may be made without departing from the scope of the present disclosure. The features of the various exemplary embodiments described herein may be combined with each other unless specifically noted otherwise.

As employed in this specification, the terms "coupled", "electrically coupled", "connected" or "electrically connected" are not meant to mean that elements must be directly coupled or connected together. Intervening elements may be provided between the "coupled", "electrically coupled", "connected" or "electrically connected" elements.

Example semiconductor devices described below may include or be formed of a semiconductor material like Silicon (Si), Silicon Carbide (SiC), Silicon Germanium (SiGe), Gallium Arsenide (GaAs) or an organic semiconductor material. The semiconductor material may be embodied as a semiconductor wafer or a semiconductor chip (e.g., a microelectronic device) containing one or more galvanic isolation devices, MOSFET integrated circuits, Insulated gate bipolar transistor (IGBT) gate drivers, input/output and control circuitry, as well as microprocessors, microcontrollers, and/or micro-electro-mechanical components or systems (MEMS), inter alia. The semiconductor chip may further include inorganic and/or organic materials that are not semiconductors, for example, insulators such as dielectric layers, plastics or metals, etc.

Referring now to the drawings and more particularly to FIG. 1A, depicted therein is a cross-sectional view of a portion of an example microelectronic device 100A having a galvanic isolation structure according to an aspect of the present disclosure. The example microelectronic device 100A may be provided as part of an integrated circuit or system-on-chip, and the like. Other configurations for the microelectronic device 100A, such as a standalone component or a hybrid circuit, are within the scope of the instant example. The microelectronic device 100A is formed on a substrate 102 such as a silicon wafer. The microelectronic device 100A includes a high voltage component 104, depicted in FIG. 1A as a high voltage capacitor configured for providing galvanic isolation between two voltage domains of an IC or system having different voltage levels. By way of illustration, a low voltage component 106 which may operate at approximately 24 volts or less, depicted as a metal oxide semiconductor (MOS) transistor with a gate dielectric layer 110 less than 70 nanometers thick. The microelectronic device 100A may optionally include a Faraday cage 108 on either side or both sides of the high voltage component 104 in one example implementation.

A field oxide (FOX) layer or region 112 may be formed in the substrate 102 (e.g., near or adjacent to a top surface of the substrate) to laterally isolate elements of the microelectronic device 100A. A pre-metal dielectric (PMD) layer 114 is formed over the substrate 102 including any FOX layer or regions prior to the deposition of subsequent metal layers (e.g., metal levels 118-1 to 118-N). Contacts 116 may be disposed through the PMD layer 114 to provide electrical connections for the low voltage component 106 and the Faraday cage 108, as well as other components or circuit portions (not specifically shown in FIG. 1A) of the microelectronic device 100A.

Plurality of metal levels 118-1 to 118-N disposed over the PMD layer 114 may include metal interconnects 120 connected to the low voltage component 106 and the Faraday cage 108, as well as any additional components, devices, or circuit portions. Intra-metal dielectric (IMD) layers 122 (e.g., dielectric materials or compositions comprised of silicon dioxide-based materials and the like) are disposed between the metal interconnects 120 in each metal level. Respective via levels 124 are disposed between the metal levels 118-1 to 118-N, wherein the example via levels 124 may include metal vias 126 connecting the metal interconnects 120. In one arrangement, IMD layers 122 may be extended as corresponding inter-level dielectric (ILD) layers of silicon dioxide-based dielectric material in each via level 124. In one arrangement, the various dielectric layers may be formed in a similar process flow using similar materials. It should be understood that other dielectric materials for the IMD layers and the ILD layers, such as low dielectric constant (K) materials, are within the scope of the instant example, for instance, FSG (Fluorinated Silicate Glass with K=3.6), OSG (Organo-silicate Glass with K=2.9) and ULK (Ultra-low k Dielectric material, with K=2.5). The IMD layers and the ILD layers may possibly include cap layers and etch stop layers of different dielectric materials, such as silicon nitride. In one embodiment, the IMD layers 122 may comprise parts or portions of the corresponding ILD layers, depending on the process sequence used to form the plurality of metal levels 118-1 to 118-N. Accordingly, reference numeral 122 may refer to either or both of IMD and ILD layers in one arrangement.

A low voltage node 130 of the high voltage component 104, depicted as a lower metal plate or bottom metal plate 130, is disposed in one of the metal levels, for example a first metal level 118-1 as depicted in FIG. 1A. A high voltage node 132 of the high voltage component 104, depicted as an upper (or top) metal plate 132, is disposed in another metal level, for example a top metal level 134 as depicted in FIG. 1A. The lower metal plate 130 and upper metal plate 132 are arranged together vertically to operate as a high voltage (HV) capacitor for providing suitable galvanic isolation having desirable breakdown properties in an example implementation of the microelectronic device 100A of the present disclosure, for example, having typical single capacitor surge capability of up to 10 kVpeak and series capacitor (reinforced isolation) surge capability of up to 17-24 kVpeak, according to certain embodiments. The combined IMD/ILD layers 122 between the low voltage node 130 and the high voltage node 132 may operate as a main dielectric structure 136 of an inter-plate dielectric composition of the high voltage component 104, comprising one or more layers and/or sub-layers as will be discussed in further detail hereinbelow. In one example, the main dielectric 136 of the high voltage capacitor 104 may be formed as a multi-layer dielectric structure or composition having a thickness 138 at least 2 microns (μm) and may be determined by a desired operating voltage of the upper plate 132 relative to the lower plate 130 and possibly the substrate 102. For example, an embodiment of the high voltage isolation component 104 in which the upper plate 132 is designed to operate at 750 volts may have a capacitor dielectric 136 with a thickness 138 of 8 μm to 14 μm.

A lower-bandgap dielectric layer 140, operative as an upper dielectric sub-layer of inter-plate dielectric structure 136 (e.g., formed as a multi-layer composition) may be disposed as an upper surface of the main dielectric 136 adjacent to the high voltage node 132, opposite from the low voltage node 130. In one example arrangement, the lower-bandgap dielectric layer 140 may include at least one dielectric sub-layer with a bandgap energy higher than a bandgap energy of a portion of the main dielectric 136 adjacent to the high voltage node 132 For example, the lower-bandgap dielectric layer stack 140 may include a first sub-layer 142 of silicon oxide nitride or oxynitride (SiON), which may be 200 nanometers to 600 nanometers thick, contacting the main dielectric 136, and a second sub-layer 144 of silicon nitride (SiN), which may be 200 nanometers to 600 nanometers thick, between the first sub-layer 142 and the high voltage node 132 and contacting both. The first sub-layer 142 of SiON has a lower bandgap energy than the silicon dioxide-based dielectric material of the main dielectric 136, and the second sub-layer 144 of silicon nitride has a lower bandgap energy than the first sub-layer 142. The main dielectric 136 and the lower-bandgap layer stack 140 may operate as an inter-plate dielectric composition between the lower and upper metal plates 130, 132, which inter-plate dielectric composition may be operative as a second dielectric layer relative to a first dielectric layer formed as a PMD layer over the FOX regions in an implementation. In one arrangement, the lower-bandgap dielectric layer 140 extends past the high voltage node 132, e.g., forming an extension 151, that laterally circumscribes a base section of the high voltage node 132 (which in some implementations may comprise a metal plate having a circular or other shape), by a distance 146, which is at least twice a thickness 148 of the lower-bandgap dielectric layer 140. In a further embodiment, there may be a lateral isolation break 150 in the lower-bandgap dielectric layer 140 contacting the high voltage node 132 such that the isolation break 150 may at least partially circumscribe the high voltage node 132. In some implementations, the isolation break or barrier 150 may surround the node 132 entirely, e.g., concentrically or otherwise. In a further embodiment having the extension 151, the isolation break 150 may form a cut-out referred to as a Silicon nitride/Oxynitride Removal region (SOR) cut-out or cut-through region.

An optional low voltage portion 152 of the lower-bandgap dielectric layer 140 may be disposed external to the isolation break 150 (and extending away therefrom) so that the low voltage portion 152 of the lower-bandgap dielectric layer 140 is separated from the lower-bandgap dielectric layer 140 contacting the high voltage node 132 (i.e., forming an upper dielectric layer of the HV isolator/capacitor 104) by the isolation break 150. The low voltage portion 152 of the lower-bandgap dielectric layer 140 may contact low voltage elements of the microelectronic device 100A, which may extend up to the lower-bandgap dielectric layer 140, such as the Faraday cage 108. The isolation break 150 may therefore be located between the high voltage node 132 and any low voltage element of the microelectronic device 100A, so that the lower-bandgap dielectric layer 140 contacting the high voltage node 132 does not contact any low voltage element. Further, the isolation break 150 advantageously prevents leakage current through an interface of the lower-bandgap dielectric layer 140 from the high voltage node 132 to a low voltage element of the microelectronic device 100A, in addition to improving lateral breakdown characteristics of the high voltage isolator 104.

In one arrangement, the isolation break 150 may be of sufficient distance that the low voltage portion 152 of the lower-bandgap dielectric layer 140, if present, is laterally separated from the lower-bandgap dielectric layer 140 contacting the high voltage node 132 by an isolation distance 154 which is at least 1.0 μm, and may extend up to 10 μm to 25 μm to advantageously provide sufficient process margins in a lithographic process for forming the isolation break 150. It will be realized that forming the lower-bandgap dielectric layer 140 with the isolation break 150 is particularly advantageous for embodiments of the high voltage component 104 operating at 500 volts or higher.

In one arrangement, the high voltage node or upper metal plate 132 may be disposed in an upper IMD layer 156 (e.g., formed to isolate the metallic structures of the top metal level 134), which covers edges of the lower-bandgap dielectric layer 140 at the isolation break 150. The upper IMD layer 156 may include oxide-based materials, similarly to some of the compositions of the main dielectric 136, e.g., a dielectric composition formed of one or more deposited silicon oxide layers, such as tetraethyl orthosilicate, also known as tetraethoxysilane (TEOS), boron and phosphorous doped TEOS (BPTEOS)/TEOS) layers), which may be based on standard interlevel dielectric processing (deposition/lithography/etching). Further, the high voltage node 132 may be connected to, or may be provided as part of a bondpad (not specifically shown) of the microelectronic device 100A, as depicted in FIG. 1A, and therefore may have a sufficient thickness to support and withstand mechanical contacting with a bond pad wire. A protective overcoat (PO) 160, for example, comprised of silicon nitride, silicon oxide nitride and/or silicon dioxide, or similar materials and compositions/combinations thereof, may overlap edges of the high voltage node 132 as depicted in FIG. 1A, wherein suitable patterning may be provided for defining an opening over the high voltage upper plate 132. Further, a PO may also include a polyimide layer of approximately 10 μm overlying the layers 160/156 and patterned to have an opening, roughly corresponding to the interior edge of distance 146, with a slope of approximately 20° outwards or away from the bond. By way of example, an electrical connection to the high voltage node 132 may be made through a bond pad wire 162.

Additional details regarding the fabrication of a microelectronic device providing galvanic isolation such as, e.g., device 100A may be found in commonly owned U.S. Pat. No. 9,299,697, incorporated by reference herein.

It should be appreciated that the low voltage portion 152 of the lower-bandgap dielectric layer 140 of the microelectronic device 100A may advantageously shield the low voltage components 106 from electric fields that may emanate due to electrical connection 162 to the high voltage node 132 (i.e., upper metal plate of the isolation capacitor). During operation of the microelectronic device 100A, when a high voltage is applied to the high voltage node 132 and a low voltage is applied to the low voltage node 130 (i.e., lower metal plate of the isolation capacitor), the lower-bandgap dielectric layer advantageously provides reliability for the main dielectric 136 by reducing an electric field at corners of the high voltage node 132. Further, the isolation break 150 advantageously provides reliability by reducing lateral breakdown discharge through the lower-bandgap dielectric layer 140 from the high voltage node 132 to a low voltage element of the microelectronic device 100A. In a still further configuration, the lower and upper metal plates 130, 132 may be provided with different lengths, widths, radii or dimensions such that their respective edges or peripheries are not coextensive, thereby reducing the likelihood of occurrence of a vertical breakdown path therebetween.

Figure 1B:
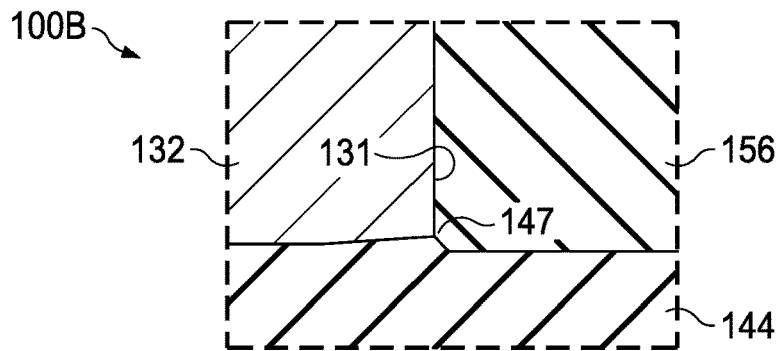
FIG. 1B depicts a topographic detail associated with an upper metal plate of the galvanic isolation structure shown in FIG. 1A.

It should be noted, however, that in an isolation capacitor embodiment set forth above there exists a dielectric discontinuity near the upper capacitor plate periphery (e.g., upper metal plate 132), especially at the lower corner or contour where a dielectric composition of one type is in contact with a dielectric composition of another type. Accordingly, an electrical field perturbation can exist at a plate corner not only due to its sharp topography but also because of different dielectric constants of the compositions used in forming layers 144 and 156, as highlighted in FIG. 1B depicting a topographic detail 100B associated with the upper metal plate 132 of the galvanic isolation structure 104 shown in FIG. 1A. As illustrated in FIG. 1B, a sidewall 131 of the upper plate 132 has a corner 147 surrounded by a low bandgap energy material of SiN comprising layer 144, which has a dielectric constant around 6.8, as well as oxide material comprising layer 156 having a dielectric constant around 3.9. Such a dielectric disjunctive interface between materials having disparate dielectric constants further exacerbates corner-related perturbations in the electric field emanating around the plate periphery of the device during operation, which can negatively impact the breakdown characteristics of the device at high voltages in addition to causing and/or exacerbating HV surge hysteresis effects. As the electric field strength is at a maximum value at the corner's "triple point", where metal (e.g. aluminum), oxide and nitride materials come together, the periphery is particularly susceptible to peripheral breakdown, which is less preferable than a capacitor's interior breakdown (which typically occurs at higher voltages, i.e., better high voltage reliability) in an isolation device.

In accordance with the teachings of the present disclosure, embodiments of a dielectric discontinuity abatement structure may be advantageously provided to prevent the formation of a dielectric disjunctive interface so as to ameliorate the electric field effects and thereby enhance an isolator's high voltage reliability. Broadly, a structure and associated fabrication process is disclosed wherein a sidewall dielectric structure is formed on at least a portion of the vertical sidewall 131 of the upper metal plate 132, wherein the sidewall dielectric structure covers the corner 147 of the upper metal plate 132 with a composition or material having a dielectric constant substantially identical to the dielectric constant of the low bandgap energy material provided directly underneath the upper metal plate 132. In an implementation, for example, the dielectric constants of the two materials may be substantially identical where these two materials are within ±10% of each other so as to help eliminate a dielectric discontinuity at the lower corner 147 of the upper metal plate 132. Example embodiments with additional details regarding a dielectric discontinuity abatement structure, preferably involving SiN material, are set forth below.

Figure 2A:
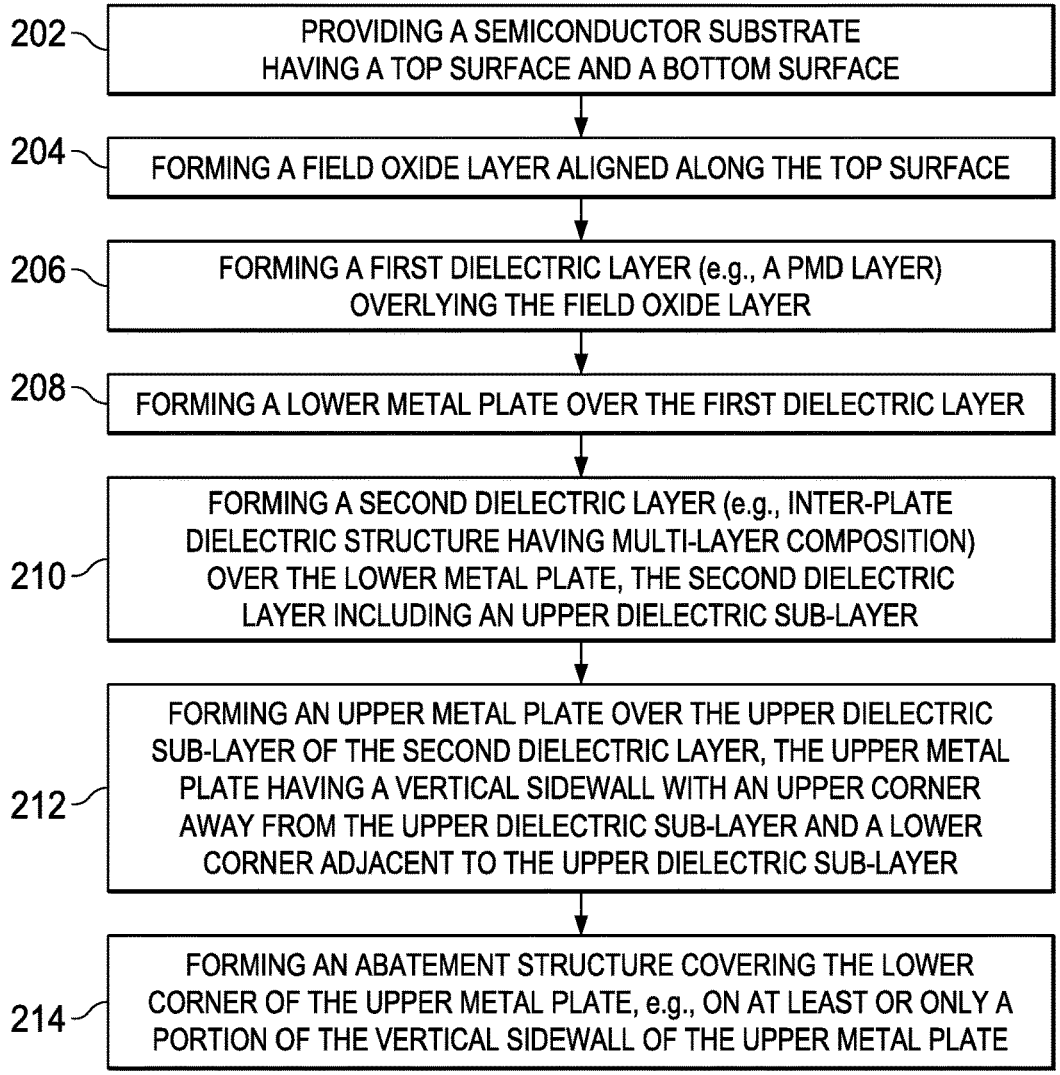
FIGS. 2A-2D depict flowcharts associated with a method for fabricating an example microelectronic device having an abatement structure according to an aspect of the present disclosure.
Figure 2B:
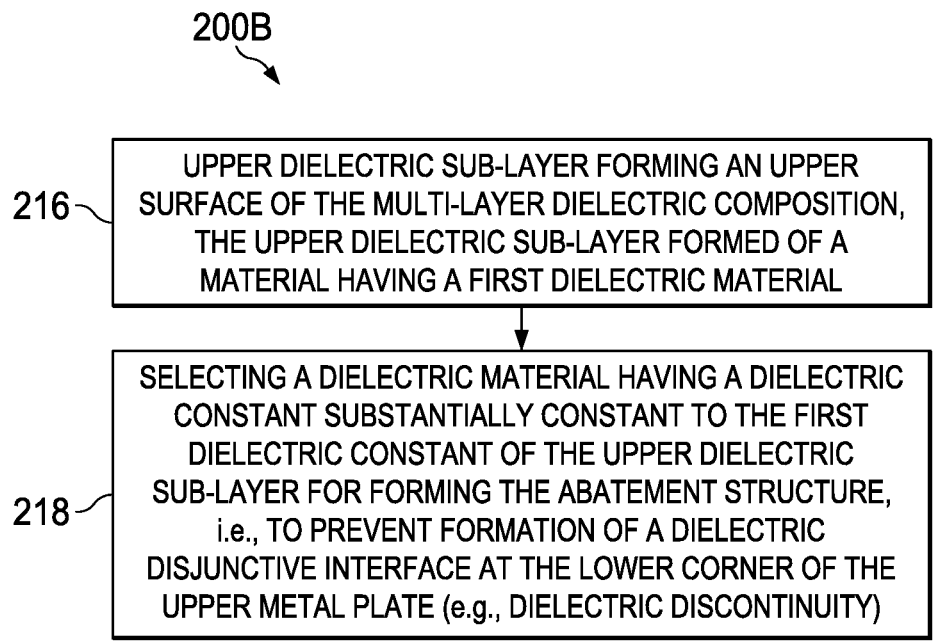
Figure 2C:
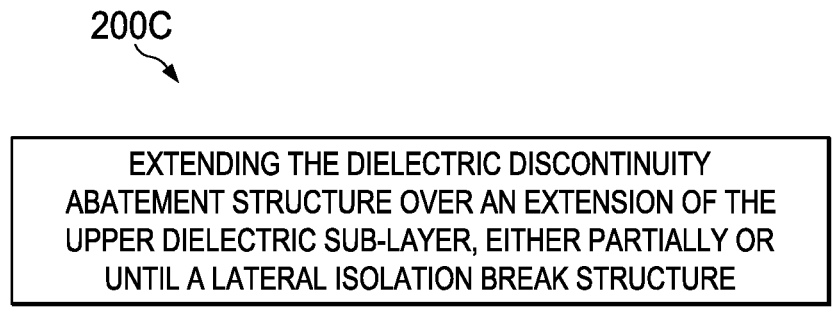

Turning to FIG. 2A, depicted therein is a flowchart associated with a method 200A of fabricating a microelectronic isolator device having an abatement structure for providing improved high voltage reliability according to an embodiment of the present disclosure. At block 202, a semiconductor substrate having a top surface and a bottom surface is provided, which may be a silicon wafer or other semiconductor substrate, or may be a dielectric substrate such as sapphire or aluminum oxide ceramic. At block 204, a field oxide (FOX) layer may be formed adjacent to or aligned along the top surface of the semiconductor substrate, e.g., using a shallow trench isolation (STI) process, a local oxidation of silicon (LOCOS) process, etc. A first dielectric layer is formed overlying the field oxide layer (block 206). In one example implementation, the first dielectric layer may comprise a PMD layer including a dielectric layer stack including a silicon nitride or silicon dioxide PMD liner 10 to 100 nanometers thick formed by a plasma enhanced chemical vapor deposition (PECVD) process, a layer of silicon dioxide, phosphorus silicate glass (PSG) or boron phosphorus silicate glass (BPSG) formed by a PECVD process, e.g., 100 to 1000 nanometers thick, commonly leveled by a chemical-mechanical polish (CMP) process, and an optional PMD cap layer, e.g., 10 to 100 nanometers of a hard material such as silicon nitride, silicon carbide nitride or silicon carbide formed by another PECVD process. A lower metal plate may be formed over the first dielectric layer (block 208). A second dielectric layer is formed over the lower metal plate, e.g., as an inter-plate multi-layer dielectric composition, which includes an upper dielectric sub-layer forming an upper surface of the multi-layer dielectric composition (block 210). As will be seen below, the upper dielectric sub-layer may be formed of a material having a first dielectric constant, e.g., SiN layer of a particular thickness. An upper metal plate is formed over the upper dielectric sub-layer of the multi-layer dielectric composition, the upper metal plate having a vertical sidewall with an upper corner away from the upper dielectric sub-layer and a lower corner adjacent to the upper dielectric sub-layer (block 212). An abatement structure is formed covering the lower corner of the upper metal plate (block 214). In one arrangement, the abatement structure may be formed, for example, as a sidewall dielectric composition on only a portion of the vertical sidewall of the upper metal plate (e.g., by using suitable deposition and etchback process flows). Preferably, the abatement structure covers or encases at least the lower corner of the upper metal plate. As set forth in FIG. 2B, an example embodiment 200B according to the teachings of the present disclosure involves forming the upper dielectric sub-layer using a material having a first dielectric constant (block 216). A dielectric material (i.e., SiN) having a dielectric constant nearly identical to the first dielectric constant of the upper dielectric sub-layer is selected for forming the abatement structure so as to prevent formation of a dielectric disjunctive interface around the lower corner of the upper metal plate (i.e., thereby providing dielectric discontinuity), as set forth in block 218. In a further variation 200C set forth in FIG. 2C, the dielectric discontinuity abatement structure may be extended over an extension of the upper dielectric sub-layer, either partially or all the way up to a lateral isolation break structure, e.g., SOR structure 150 exemplified in FIG. 1A above.

Figure 2D:
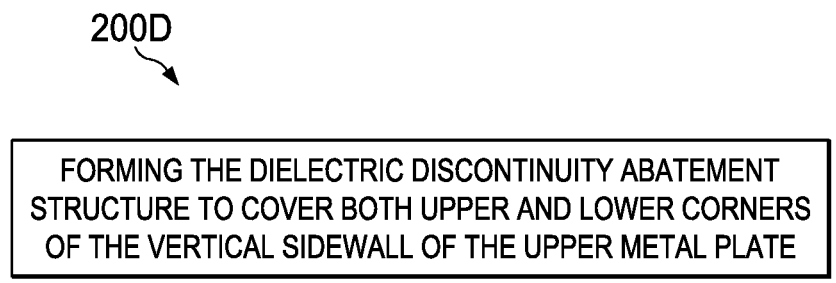

In a still further example embodiment 200D, the dielectric discontinuity abatement structure may be formed such that both upper and lower corners of the vertical sidewall of the upper plate may be encased or encapsulated, as set forth in FIG. 2D. It will be appreciated that in such a variation, the dielectric discontinuity abatement structure may at least partially cover a top surface of the upper metal plate. Depending on the thicknesses involved in an example metal process for the upper metal plate, a sidewall encapsulating abatement structure formed according to this embodiment may encounter thermo-mechanical issues (e.g., step coverage, different coefficients of thermal expansion, etc.), however.

One skilled in the art will recognize upon having reference hereto that fabrication processes such as chemical vapor deposition, etching and photolithography, chemical-mechanical polish or planarization, sputtering, electroplating, etc. may be employed at various stages in a combination of the above flows.

Figure 3A:
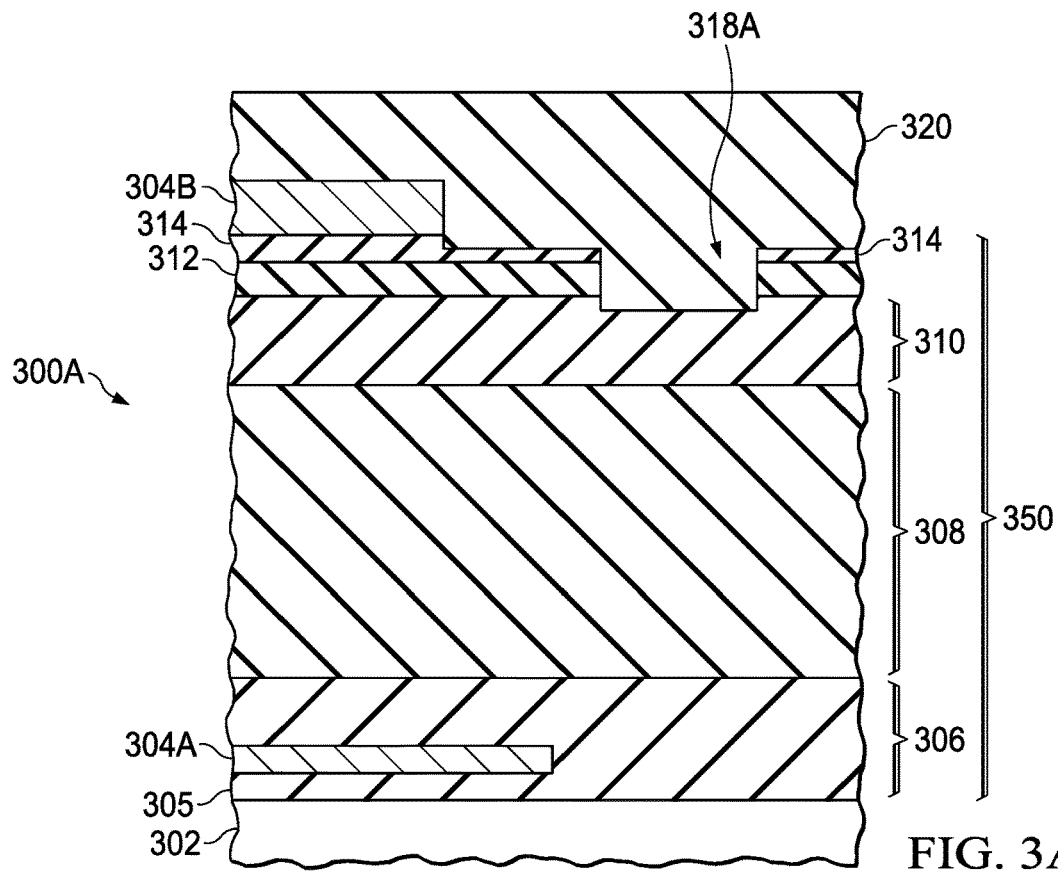
FIGS. 3A and 3B depict cross-sectional views of a portion of a galvanic isolation structure illustrating the formation of a sidewall encapsulation operative as a dielectric discontinuity abatement structure according to an aspect of the present disclosure.
Figure 3B:
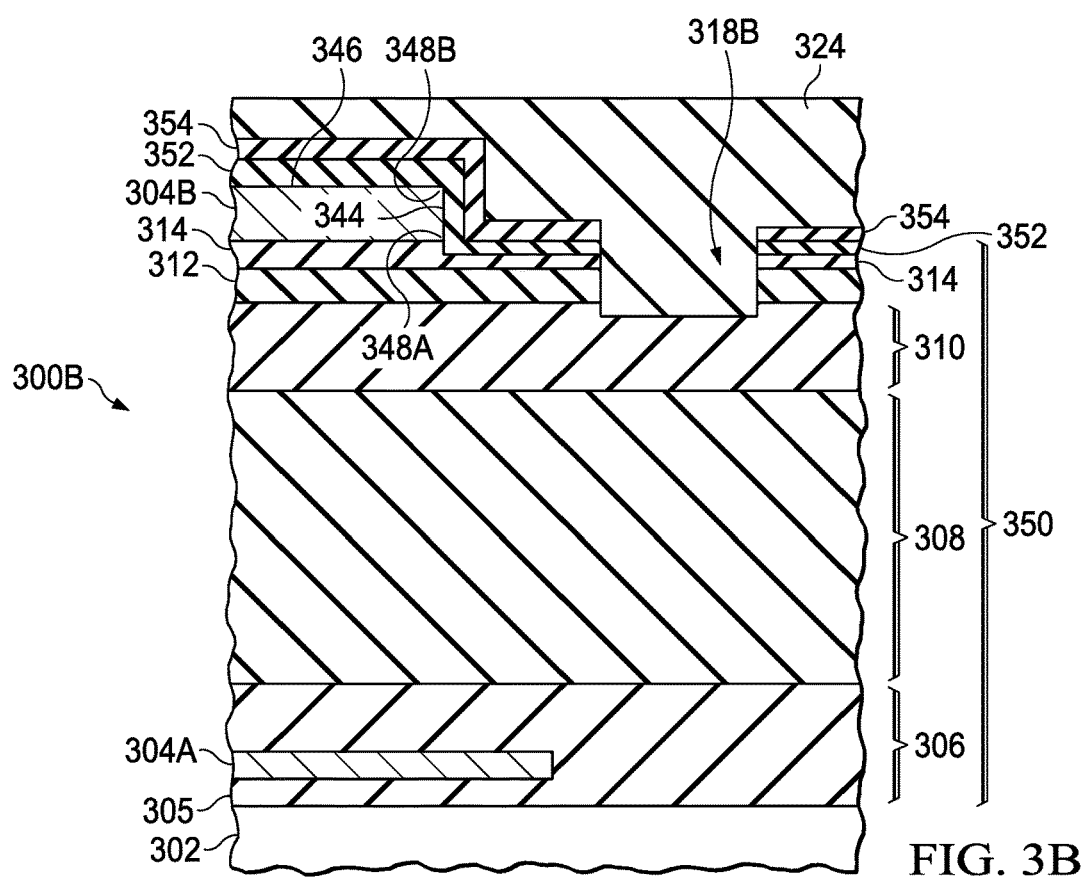

FIGS. 3A and 3B depict cross-sectional views of a portion of a galvanic isolation structure illustrating formation of a sidewall encapsulation operative as a dielectric discontinuity abatement structure according to an embodiment of the present disclosure. It will be apparent to skilled artisans that the cross-sectional views of FIGS. 3A/3B are simplified renditions of a portion of the cross-sectional view depicted in FIG. 1A, whose description may therefore be applied here as well, mutatis mutandis. In FIG. 3A, an example galvanic isolation structure 300A without sidewall encapsulation is illustrated. A substrate 302 supports a TEOS layer 306 as an ILD layer wherein a lower metal plate 304A is disposed over a PMD deposition 305 that may be part of the ILD layer 306. Further dielectric layers, e.g., TEOS layers 308, 310, SiON layer 312 and SiN layer 314, are exemplary of a multi-layer dielectric composition operating as an inter-plate dielectric structure 350 including at least a portion of TEOS layer 306, wherein various TEOS layers may be provided as low stress films, high stress films and/or a combination thereof, having varying thicknesses depending on the particular HV isolation implementation. An upper metal plate 304B is formed over SiN layer 314, which operates as upper dielectric sub-layer of the inter-plate dielectric composition 350. As illustrated, the lower metal plate 304A is longer (or wider) than the upper metal plate 304B (e.g., by a few microns (μm)). Also, the upper metal plate 304B is thicker than the lower metal plate 304A, the thickness depending on the specific galvanic isolation implementation and/or bond pad metallurgy (e.g., to withstand thermo-mechanical stresses of pad formation and bonding processes). An SOR cut 318A is illustrative of a lateral isolation break such as isolation break 150 illustrated in FIG. 1A above. A TEOS layer 320 may be provided as a PO layer as previously described.

An example galvanic isolation structure 300B having a sidewall encapsulation formation as a dielectric discontinuity abatement structure is illustrated in FIG. 3B, wherein a SiN encapsulation layer 352 is formed over the upper metal plate 304B encasing a lower corner 348A, entire height of a vertical sidewall 344 extending from the lower corner 348A to an upper corner 348B, as well as at least partially overlying a top surface 346 of the upper metal plate 304B. As discussed above, encapsulation layer 352 is comprised of a SiN composition having substantially the same dielectric properties of the upper dielectric sub-layer 314. In one example embodiment, SiN encapsulation layer 352 operating as a dielectric discontinuity abatement structure may also have similar stoichiometry as that of the composition forming the upper dielectric sub-layer 314 immediately underlying the upper metal plate 304B. In a further embodiment, a SiOx layer 354 may be formed over the SiN layer 352 for additional thermo-mechanical robustness. In a still further embodiment, an SOR cut 318B may be formed as an isolation break formed through an extension of the layer stack comprising layer 354, SiN stack 352/314 as well as SiON layer 312, and potentially through at least part of the top-most TEOS layer of the inter-plate dielectric structure 350, e.g., low stress TEOS layer 310. Further, a low stress TEOS layer 324 may be provided as a protective overcoat for the isolation device 300B, which may be patterned to define a bond pad opening over the upper metal plate 304B as previously discussed.

In one arrangement, SiN layer 352 and SiOx layer 354 formed over the upper surface 346 of the upper metal plate 304B may be fabricated using various deposition processes (e.g., CVD) to achieve suitable thicknesses depending on the isolation application. For example, SiN layer 352 may have a thickness of 0.2 μm to 1.0 μm, whereas SiOx layer 354 overlying SiN layer 352 may have a thickness of 0.5 μm to 2.0 μm according to one example implementation. As noted previously, inter-plate dielectric composition 350 may include one or more TEOS layers of varying thicknesses and tensile/compressive stress properties. Further, although layer stack 354/352/314 is illustrated as extending up to and beyond SOR cut 318B (e.g., as an extension) from the vertical sidewall 344, an alternative arrangement comprise only a partial extension of one or more constituent layers of the stack, e.g., SiN layer stack 352/314, while still encasing the lower corner 348A.

Figure 4A:
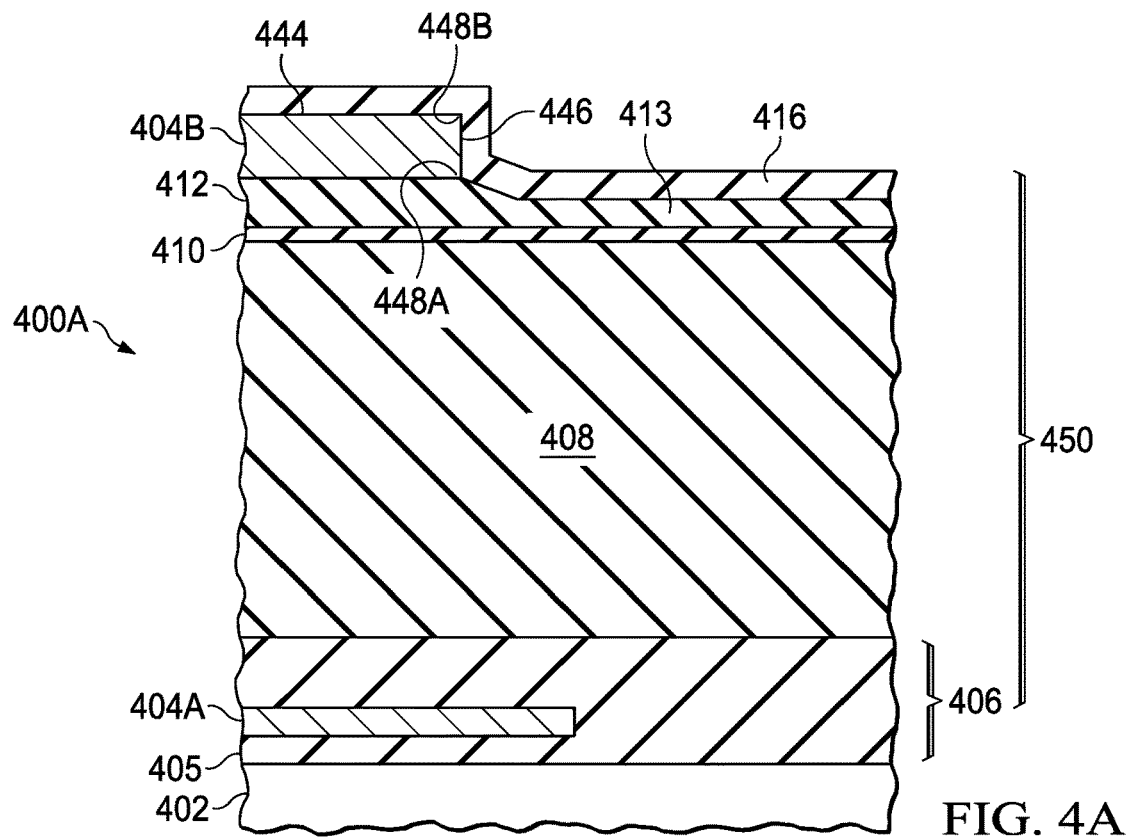
FIGS. 4A-4D depict cross-sectional views of a portion of a galvanic isolation structure illustrating the formation of a partial sidewall encasement operative as a dielectric discontinuity abatement structure according to another aspect of the present disclosure.
Figure 4B:
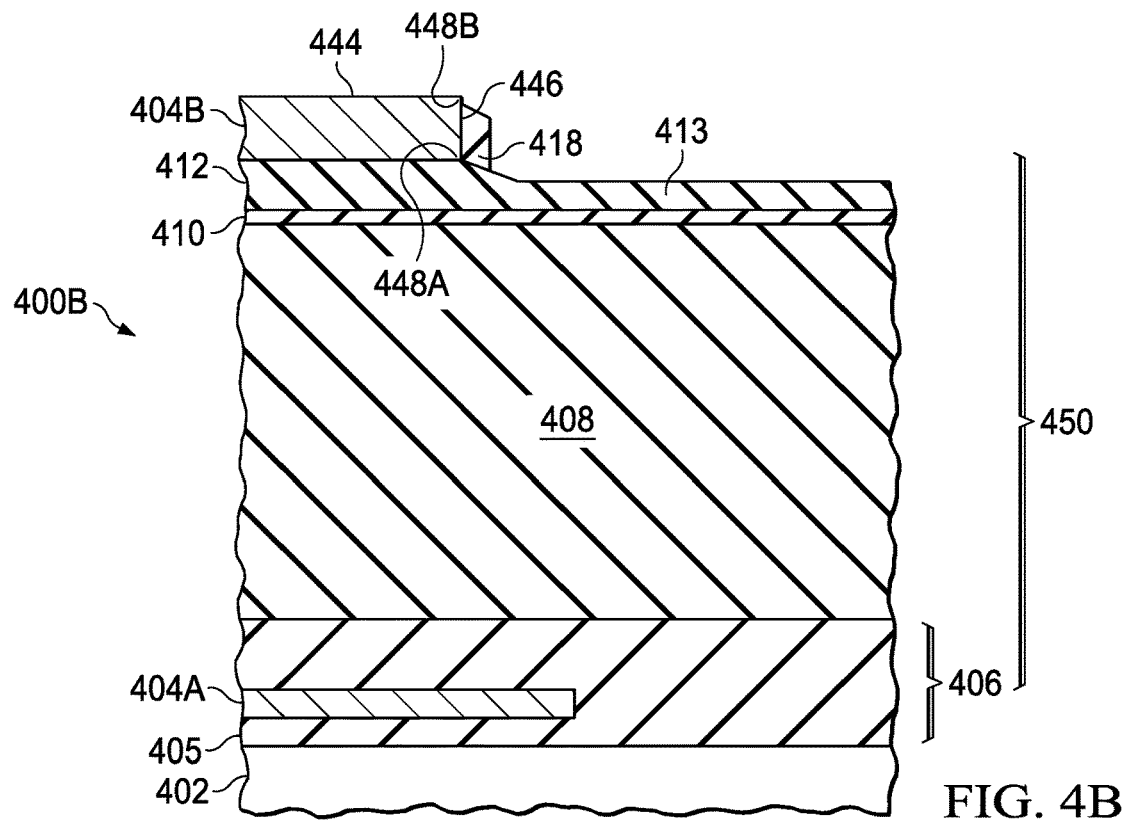

FIGS. 4A-4D depict cross-sectional views of a portion of a galvanic isolation structure illustrating formation of a partial sidewall encapsulation operative as a dielectric discontinuity abatement structure according to further embodiments of the present disclosure. In FIG. 4A, an example galvanic isolation structure 400A is shown in a cross-sectional view wherein an SiN blanket deposition layer 416 is formed over an upper metal plate 404B overlying an upper dielectric sub-layer 412 of SiN. As in the embodiment shown in FIGS. 3A/3B, example galvanic isolation structure 400A may also include an SiON layer 410 formed underneath the upper SiN dielectric layer 412, which may form at least part of an inter-plate dielectric structure 450 that may include one or more TEOS layers 406/408 or portions thereof, disposed between the upper metal plate 404B and a lower metal plate 404A supported by a substrate 402 having a PMD layer 405. In one example implementation, the SiN blanket deposition layer 416 may have a thickness of about 0.5 μm to 3.0 μm, and may extend over a top surface 444, covering sidewall 446, and upper and lower corners 448B, 448A of the upper metal plate 404B, in addition to extending over an extension 413 of SiN and SiON layers 412/410. FIG. 4B illustrates an example galvanic isolation structure 400B wherein a blanket anisotropic etchback process is employed to selectively remove the SiN deposition layer 416 such that the entire SiN deposition over the top surface 444 of the upper metal plate 404B as well as at least a portion of the SiN blanket deposition over the extension 413 is etched off, leaving a vertical dielectric structure 418 operative as a dielectric discontinuity abatement structure on the sidewall 446 extending down to cover the lower corner 448A. In one embodiment, such an etchback process may render the upper corner 448B of the metal plate 404B devoid of any SiN encasement/encapsulation. The remaining vertical dielectric structure 418 along the sidewall 446 may comprise a thickness of about 0.7 μm to 2.5 μm in one example implementation, possibly tapering to a thicker structure near the lower corner 448A. Although not specifically shown in FIG. 4B, one skilled in the art will recognize that a lateral isolation cut-through structure may be formed in the extension 413, similar to the embodiments described hereinabove. Further, a patterned PO layer may be formed covering the galvanic isolation structure 400B to provide further protection.

Figure 4C:
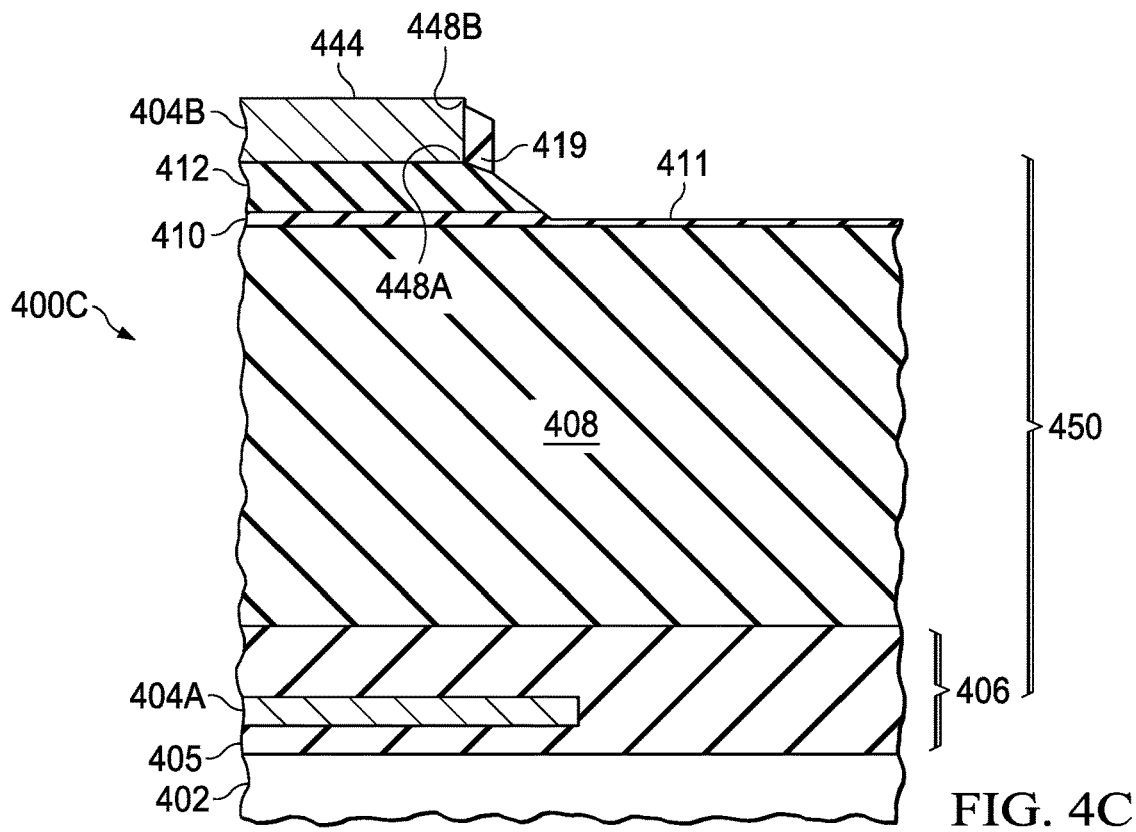

FIG. 4C illustrates yet another example embodiment of a galvanic isolation structure 400C comprising a partial-only dielectric discontinuity abatement structure 419 wherein a more aggressive etchback process may be employed so as to remove extensions of SiN layers 412/416 over the SiON sub-layer 410 as well as a partial etchback of the SiON sub-layer 410, resulting in a thinner SiON portion 411 in the open field region. In a still further embodiment 400D shown in FIG. 4D, yet another variation of an etchback process may be employed to give rise to a partial extension 443 of SiN stack over the SiON sub-layer 410, associated with a dielectric discontinuity abatement structure 421 formed along the vertical sidewall of the upper metal plate 404B. It will be recognized by skilled artisans that the SiON sub-layer 410 over the field region may also be somewhat thinner in this embodiment as well, similar to the embodiment shown in FIG. 4C. Additionally, it should be understood that variations of the foregoing embodiments as well as other dielectric discontinuity abatement structures extending over varying portions of the step/height of the vertical sidewall and having different SiN layer arrangements and thicknesses for providing electric field amelioration/mitigation may be obtained by varying the etchback process flows depending on implementation. Further, example implementations may or may not involve lateral isolation cut-through structures, thereby giving rise to still further variations in conjunction with or independent of the cut-through structures (e.g., extending the SiN layer and terminating with lateral isolation), resulting in various levels of protection against HV breakdown (e.g., both lateral and/or vertical breakdown modes).

Figure 4D:
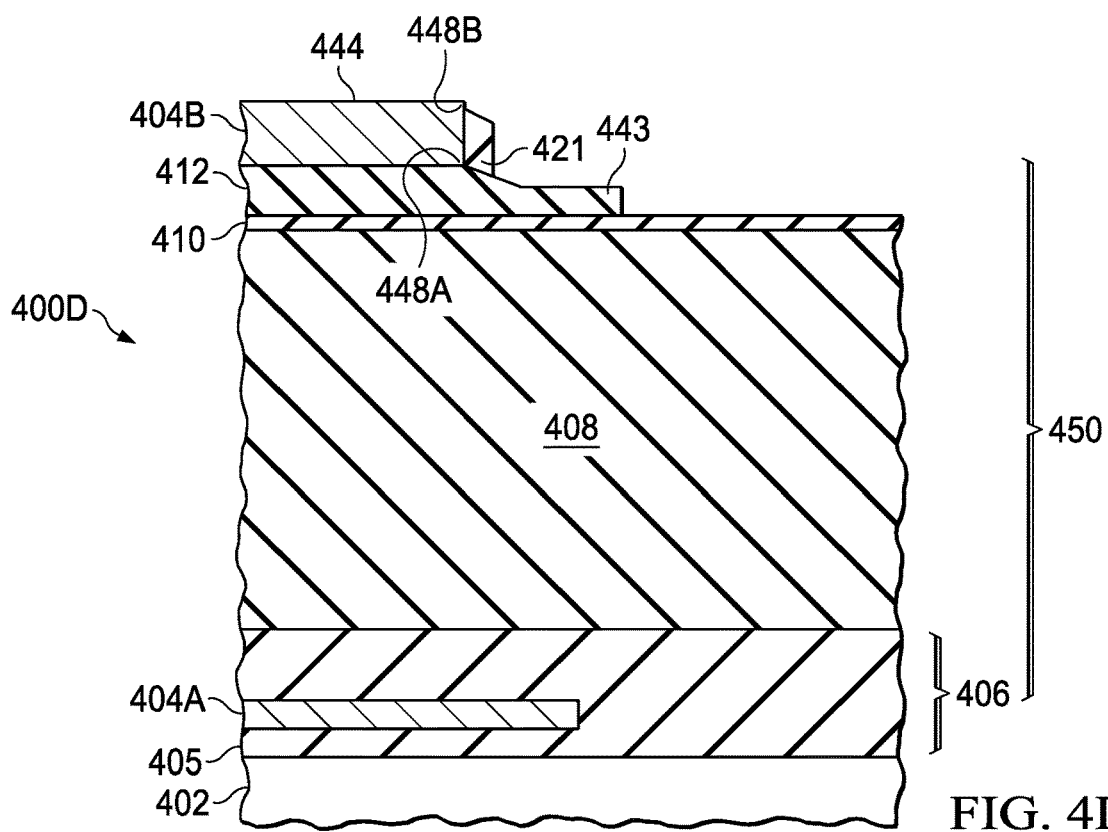

In one example embodiment, SiN deposition for forming a dielectric discontinuity abatement structure may involve a low temperature deposition process at around 120° C. to 250° C., to prevent cracking over a thick metallic surface (e.g., the upper metal plate of an HV capacitor). In another embodiment that involves a bi-layer deposition, a high temperature deposition process may be utilized for depositing SiN and SiON compositions at around 350° C. to 400° C. It will be recognized that whereas the embodiment shown in FIG. 3B involves a complete encapsulation of the sidewall of the upper metal plate of a capacitor (i.e., both lower and upper corners of the periphery of the upper metal plate are covered), the embodiment of FIGS. 4B-4D provides a partial "encapsulation" of the sidewall wherein a vertical dielectric structure is provided for covering only the lower corner of the sidewall and preferably extending upward for at least a portion of the height of the sidewall. In each of these example embodiments, the lower corner is encased with substantially identical dielectric materials so as to advantageously avoid the formation of a "triple point" thereat. In general, the dielectric constant is matched for the sidewall layer vs. the layer under the metal plate according to an embodiment of the present disclosure to reduce the electric field discontinuity at the capacitor periphery, wherein the dielectric material used has a bandgap significantly lower than $SiO_2$. It will be appreciated that a wide range of the matching dielectric constants may be provided for an example SiN film, with a typical PECVD-based SiN film having a dielectric constant in the neighborhood of 7.

Skilled artisans will further appreciate that a partial SiN encapsulation embodiment may be more advantageous than an embodiment involving full SiN encapsulation of the capacitor sidewall. For example, a bi-layer deposition over a metal surface involving SiN/SiON may experience thermal cycling issues because of the disparate coefficients of thermal expansion between the bi-layer composition (typically lower values) and the underlying metal plate (typically much higher values). Moreover, the SiON sub-layer may present planarization issues during subsequent process stages due to added step coverage. In example embodiments of a dielectric discontinuity abatement structure of the present disclosure, favorable results have been obtained in silicon wafer splits wherein a reduction of up to ~50% in peak electric fields at the capacitor plate corners have been observed in applicable electrical test scenarios and/or simulations, with concomitant improvements in HV breakdown performance.

Based on the foregoing description, skilled artisans will recognize that embodiments disclosed herein advantageously provide enhanced HV surge suppression capability as well as reduced HV surge hysteresis in galvanic isolation devices. Further, as SiN deposition processes can be fairly easily integrated within an example fabrication flow, manufacture costs are not unduly impacted.

Although various embodiments have been shown and described in detail, the claims are not limited to any particular embodiment or example. For instance, it should be appreciated that whereas a SiN encapsulation structure has been described in detail, other dielectric compositions such as, e.g., silicon carbide nitride, silicon oxide carbide nitride, tantalum pentoxide, diamond-like carbon, titanium dioxide, aluminum nitride, aluminum oxide, silicon monoxide, and zinc oxide, etc., having varying bandgap energies (in eV) and dielectric constants may also be used in further variations of the present disclosure. Additionally, although the lower/bottom capacitor plate of an isolation device is shown in the example embodiments at a particular metal level of a multi-level metal process (e.g., at the lowest level or MET1 level), it should be understood that the lower capacitor plate may be disposed at any of the metal levels below the top capacitor plate of the isolation device.

Further, in at least some additional or alternative implementations, the functions/acts described in the depicted flowcharts may occur out of the order shown in the flowcharts. For example, two blocks shown in succession may in fact be executed substantially concurrently or the blocks may sometimes be executed in the reverse order, depending upon the functionality/acts involved. It should therefore be clearly understood that the order or sequence of the acts, steps, functions, components or blocks illustrated in any of the flowcharts depicted in the drawing Figures of the present disclosure may be modified, altered, replaced, customized or otherwise rearranged within a particular flowchart, including deletion or omission of a particular act, step, function, component or block. Moreover, the acts, steps, functions, components or blocks illustrated in a particular flowchart may be inter-mixed or otherwise inter-arranged or rearranged with the acts, steps, functions, components or blocks illustrated in another flowchart in order to effectuate additional variations, modifications and configurations with respect to one or more processes for purposes of practicing the teachings of the present patent disclosure.

Additionally, none of the above Detailed Description should be read as implying that any particular component, element, step, act, or function is essential such that it must be included in the scope of the claims. Reference to an element in the singular is not intended to mean "one and only one" unless explicitly so stated, but rather "one or more." All structural and functional equivalents to the elements of the above-described embodiments that are known to those of ordinary skill in the art are expressly incorporated herein by reference and are intended to be encompassed by the present claims. Accordingly, those skilled in the art will recognize that the exemplary embodiments described herein can be practiced with various modifications and alterations within the spirit and scope of the claims appended below.

What is claimed is:

1. An electronic device, comprising:
    a first dielectric layer having a first dielectric constant located over a semiconductor substrate;
    a metal structure located over the first dielectric layer, the metal structure having a side surface;
    a second dielectric layer having a second different dielectric constant located adjacent the metal structure; and
    a dielectric structure having the first dielectric constant located between the side surface of the metal structure and the second dielectric layer.

2. The electronic device as recited in claim 1, wherein the first dielectric layer and the dielectric structure comprise silicon nitride.

3. The electronic device as recited in claim 1, wherein the second dielectric layer comprises silicon dioxide.

4. The electronic device as recited in claim 1, wherein the second dielectric layer extends through an opening in the first dielectric layer to a third dielectric layer having the second dielectric constant.

5. The electronic device as recited in claim 4, wherein the second dielectric layer extends through an opening in a fourth dielectric layer located between the first and third dielectric layers, the first, third and fourth dielectric layers having different chemical compositions.

6. The electronic device as recited in claim 1, wherein the metal structure comprises a first capacitor plate that is coupled via the first dielectric layer to a second capacitor plate.

7. The electronic device as recited in claim 1, wherein the first dielectric constant is greater than 6 and the second dielectric constant is less than 4.

8. The electronic device as recited in claim 1, wherein the first dielectric layer has a first thickness where the first dielectric layer touches the metal structure and has a second smaller thickness where the first dielectric layer touches the second dielectric layer.

9. The electronic device as recited in claim 8, wherein the first dielectric layer has a sloped portion between the first thickness and the second thickness, and the dielectric structure forms a continuous interface with the sidewall and the sloped portion.

10. A method of forming an electronic device, comprising:
    forming a first dielectric layer having a first dielectric constant over a semiconductor substrate;
    forming a metal structure over the first dielectric layer, the metal structure having a side surface;
    forming a second dielectric layer having a second different dielectric constant adjacent the metal structure; and
    forming a dielectric structure having the first dielectric constant between the side surface of the metal structure and the second dielectric layer.

11. The method as recited in claim 10, wherein the first dielectric layer and the dielectric structure comprise silicon nitride.

12. The method as recited in claim 10, wherein the second dielectric layer comprises silicon dioxide.

13. The method as recited in claim 10, wherein the second dielectric layer extends through an opening in the first dielectric layer to a third dielectric layer having the second dielectric constant.

14. The method as recited in claim 13, wherein the second dielectric layer extends through an opening in a fourth dielectric layer located between the first and third dielectric layers, the first, third and fourth dielectric layers having different chemical compositions.

15. The method as recited in claim 10, wherein the metal structure comprises a first capacitor plate that is coupled via the first dielectric layer to a second capacitor plate.

16. The method as recited in claim 10, wherein the first dielectric constant is about 7 and the second dielectric constant is about 4.

17. The method as recited in claim 10, wherein the first dielectric layer has a first thickness where the first dielectric layer touches the metal structure and has a second smaller thickness where the first dielectric layer touches the second dielectric layer.

18. The method as recited in claim 17, wherein the first dielectric layer has a sloped portion between the first thickness and the second thickness, and the dielectric structure forms a continuous interface with the sidewall and the sloped portion.

* * * * *